SEMICONDUCTOR VARIO-LOSSER CIRCUIT

Filed Oct. 30, 1961 2 Sheets-Sheet 1

INVENTORS
WALTER C. BENGER
JOHN L. HANNA
DAVID G. VICE
BY— Smart + Biggar.
ATTORNEYS.

SEMICONDUCTOR VARIO-LOSSER CIRCUIT

Filed Oct. 30, 1961 2 Sheets-Sheet 2

INVENTORS
WALTER C. BENGER
JOHN L. HANNA
DAVID G. VICE
BY- Smart & Biggar.
ATTORNEYS.

United States Patent Office 3,202,929
Patented Aug. 24, 1965

3,202,929
SEMICONDUCTOR VARIO-LOSSER CIRCUIT

Walter C. Benger, Ottawa, Ontario, John L. Hanna, Belleville, Ontario, and David G. Vice, Ottawa, Ontario, Canada, assignors to Northern Electric Company Limited, Montreal, Quebec, Canada Filed Oct. 30, 1961, Ser. No. 148,654
17 Claims. (Cl. 330—138)

This invention relates to vario-losser circuits having both expansion and compression characteristics.

Vario-losser circuits are known in the art in which the input impedance of the circuit or the gain of the circuit varies as a function of the amplitude of the input signal. Circuits are known which cause the gain of the circuit to decrease with increasing signal input (compression), and other circuits are known which cause the gain to increase with an increase in signal input (expansion). However, circuits in the prior art have rarely attempted to combine both expansion and compression features in one circuit, and such attempts as have been made have failed to achieve the desirable expansion-compression features made possible by the present invention.

It is desirable in many audio-frequency amplifier circuits to have low gain for very low signal inputs (so that spurious low signals and low amplitude noise will not be reproduced in the output), to have a linear range in which gain is appreciably high (for normal input signal levels), and to have a compression range for high input signal levels which is characterized by reduction of gain for increased input signal levels, thereby preventing the amplifier from overloading the output circuits. Thus, it is seen that in such applications both an expansion operation causing the amplifier to change its operating characteristics from low gain to intermediate gain and a compression characteristic causing the amplifier to reduce gain at high signal levels is desirable.

To achieve this desirable combination of expansion and compression features, the present invention provides an electric circuit comprising an input circuit, a vario-losser network connected in the input circuit and adapted to vary the loss of signal in passing through the input circuit, a source of direct current, an expansion network connected to the vario-losser network and adapted to permit current to flow from said source of direct current through the vario-losser network at low signal levels and adapted to cut off the flow of direct current to the vario-losser network at a predetermined signal level, means to cut off the expansion circuit from the vario-losser network at signal levels above said predetermined signal level, a compression circuit sensitive to signal level and adapted to cause flow of current to the vario-losser network at signal levels above a second predetermined signal level thereby to vary the loss of signal in passing through the input circuit.

The circuit according to the present invention is thus seen to operate at reduced gain, with current flowing through the vario-losser network, at very low signal levels. At somewhat higher signal levels, the expansion circuit cuts off the flow of direct current to the vario-losser network, and the circuit operates in an intermediate linear range. At still higher signal levels, the compression circuit begins to produce direct current which flows through the vario-losser network, thereby increasing the loss therein of a signal appearing at the input and hence reducing the output signal gain.

One of the features of the present invention is the blocking of the expansion circuit from the rest of the circuit at signal levels above a certain predetermined level so that the expansion circuit does not interfere with the operation of the compression circuit, and conversely.

Many of the previous vario-losser amplifiers required a specially designed amplifier to meet the requirements of the vario-losser circuits. However, the circuit according to the present invention allows the use of any conventional audio amplifier to amplify the input signals. The present invention operates in optimum fashion using a push-pull amplifier and an associated push-pull network, but this is not an absolute necessity.

The invention and a brief discussion of the prior art will now be described with reference to the accompanying drawings, in which.

Figure 1:
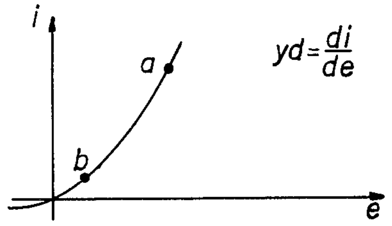
FIGURE 1 is a graph showing the current-voltage characteristics of a semi-conductor diode.
Figure 2:
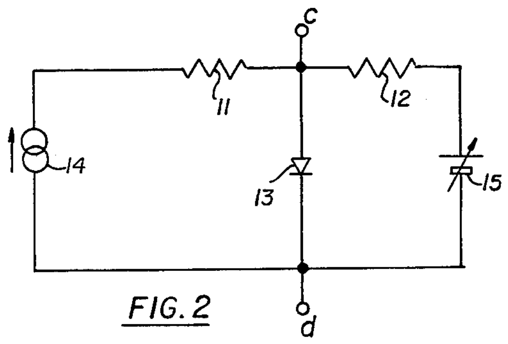
FIG. 2 (PRIOR ART)
FIGURE 2 is a simplified circuit diagram of a vario-losser circuit of the type known in the prior art.

FIGURE 1 shows the current-voltage characteristic of a semi-conductor diode of the silicon type. It will be noted that the dynamic conductance $y_d$, which is equal to *di/de*, is relatively high at the point *a* and relatively low at the point *b*. A vario-losser circuit, such as the simple known vario-losser circuit shown in FIGURE 2, operates by utilizing the variable impedance characteristic of the semi-conductor diode. In FIGURE 2, an A.C. signal source 14 supplies current through a resistor 11 (of 1000 ohms resistance, say) to a load (not shown) connected across the terminals *cd* in parallel with the semi-conductor diode 13. A variable D.C. voltage source 15 in series with a resistor 12 (of resistance 100,000 ohms, say) is also connected across the diode as shown. Assume initially that the A.C. current source 14 is passing current through the diode 13 and the load, while the voltage output of the variable voltage source 15 is zero. In this condition of operation, the diode 13 will have relatively high impedance, and almost all the current supplied by the signal source 14 will pass through the load. As the voltage output of the voltage source 15 is raised from zero to some positive value, the diode will conduct D.C. current, and its impedance will drop, thereby drawing an appreciable amount of current from the signal source 14. If the voltage output from the source 15 is further increased, say from *b* to *a* in FIGURE 1, the conductance of the diode will increase accordingly, and still less of the output current of the signal source 14 will pass to the load. The diode thus acts as the shunt leg of a voltage divider (the series leg of which is the resistor 11), and the diode impedance varies as a function of the D.C. current through the diode. As the D.C. voltage of the source 15 is increased, the load A.C. voltage and current are decreased. Many vario-losser circuits known in the prior art and the vario-losser circuits according to the present invention operate by controlling the loss of a circuit by means of varying the amount of direct current flowing through a semi-conductor diode.

Figure 3:
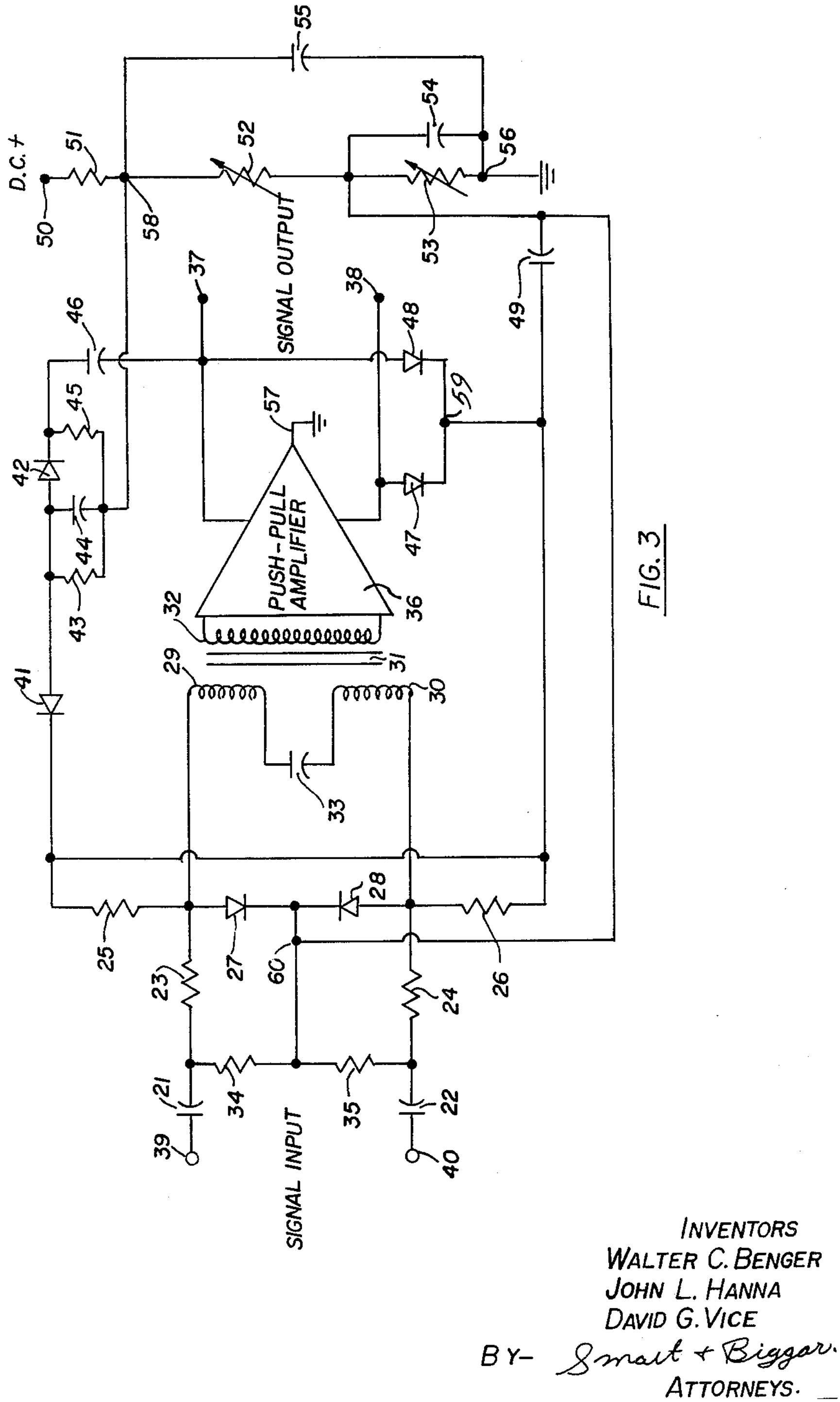
FIGURE 3 is a circuit diagram of a preferred embodiment of a vario-losser circuit according to the invention.

FIGURE 3 shows a preferred embodiment of a vario-losser circuit according to the present invention. As indicated above, this circuit varies the loss by means of variation of direct current flow through vario-losser diodes. The signal input to the circuit is fed in push-pull manner to the terminals 39 and 40. The signal then passes through coupling capacitors 21 and 22 and series resistors 23 and 24 to the two halves 29 and 30 of the primary winding of transformer 31. The two halves of the primary are connected together through a capacitor 33, which prevents saturation of the transformer core by D.C. current, and also prevents imbalance in the transformer which might otherwise be caused by flow of spurious D.C. currents through the primary. Vario-losser diodes 27 and 28 are connected across the primary as shown. These diodes are preferably of the silicon semiconductor type. The proportion of the input signal appearing across the primary windings 29 and 30 of transformer 31 varies according to the amount of D.C. current passing through the two diodes 27 and 28, as will be described in greater detail below. The resistors 34 and 35 have no function other than to bleed the capacitors 21 and 22.

A push-pull amplifier 36 is connected to the secondary winding 32 of the transformer 31. This amplifier amplifies the signal received from the transformer and feeds an output to its load across terminals 37 and 38. The push-pull amplifier is grounded at 57, the output of the amplifier being the usual double ended output. The amplifier 36 may be any conventional audio-frequency signal amplifier with suitable gain.

A supply of positive D.C. voltage is connected to terminal 50, and flows to ground through resistor 51 and variable resistors 52 and 53. At low signal levels, D.C. current will flow from the point 58 through resistor 43, diode 41, resistor 25 and diode 27 in parallel with resistor 26 and diode 28 to the point 60 and thence to ground through resistor 53. In this condition of operation, with direct current flowing as described, the operating condition of the circuit of FIGURE 3 is shown on FIGURE 4 as the lower linear range 1. The three curve labels "50%," "75%" and "max" refer respectively to a resistance setting of variable resistor 52 corresponding to 50%, 75%, and maximum setting of the resistance.

One half of the signal output is coupled by capacitor 46 from terminal 37 and referenced via resistor 45 to the fixed D.C. potential appearing at point 58. As the signal input increases to, for example, point M, N or P (depending on setting of variable resistor 52), the biasing of diode 42, which is determined by the setting of variable resistor 52, is overcome and the negative peaks of said one half the signal output are rectified by the diode 42 (which, like all the diodes shown in FIGURE 3, is preferably a silicon semi-conductor diode), thereby developing a negative D.C. voltage at the junction of diode 42 and capacitor 44 with respect to the voltage at reference point 58. This D.C. potential opposes the D.C. potential appearing at the point 58, and thereby reduces the amount of direct flowing through the vario-losser circuit. The impedances of diodes 27 and 28 vary in dependence on the current through them as fully described in connection with FIGURES 1 and 2. The proportion of the input signal voltage between terminals 39 and 40 appearing across the primary windings 29 and 30 of transformer 31 depends on the ratio of the dynamic impedances of diodes 27 and 28 to the impedances of the resistors 23 and 24. The aforementioned reduction in current results in an increase in the impedances of diodes 27 and 28 and hence a larger proportion of the input signal is applied to the primary windings 29 and 30 of transformer 31. This increased proportion of the input signal is coupled through the transformer 31, resulting in an increase in signal to the input of the amplifier 36. This increase in input signal to the amplifier 36 in turn produces an increased output, developing a greater voltage across resistor 43 and capacitor 44 in opposition to the positive voltage at point 58. This positive feedback operation of the circuit continues until the two opposing voltages cancel, cutting off the flow of direct current to the vario-losser circuit. Any further increase in signal output develops an increased potential across resistors 43 and capacitor 44, but this does not cause direct current to flow in the opposite direction through the vario-losser circuit because of the manner in which diodes 27, 28 and 41 are biased.

Figure 4:
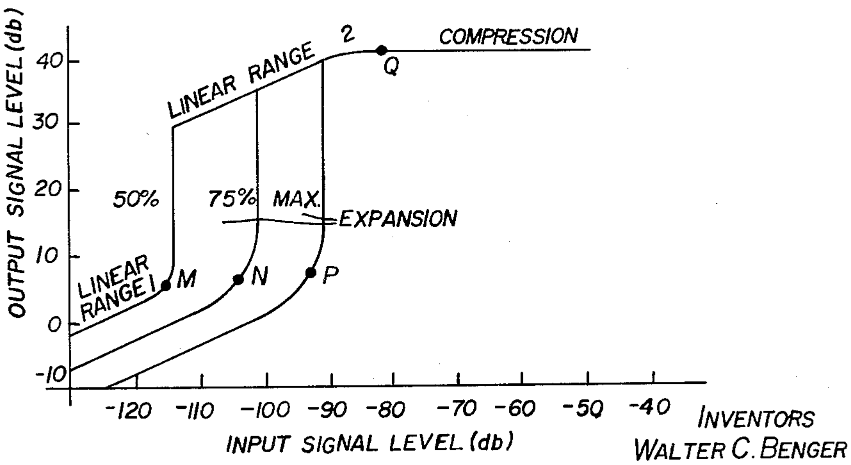
FIGURE 4 is a graph showing the relationship of output signal level to input signal level for the circuit shown in FIGURE 3.

The positive feedback operation of the circuit just described is termed "expansion," and FIGURE 4 shows graphically how the circuit behaves in the expansion region. Points M, N and P indicate the expansion threshold, i.e. the point of operation at which the diode 42 begins to conduct. The positive feedback operation rapidly brings the circuit to the linear range 2 shown on FIGURE 4. It will be understood that in range 2, since the direct-current through the vario-losser circuit is cut-off following expansion the output signal is proportional to the input signal, assuming a substantially linear amplifier 36, and hence range 2 is substantially linear, up to the point where the compression circuit described below takes effect and again activates the vario-losser circuit. The expansion threshold and the amount of expansion are governed by the setting of the variable resistor 52.

Diodes 47 and 48 are referenced via the output circuit of amplifier 36 to ground at point 56. At suitably high levels of signal output, positive peaks of the signal output will be greater than the D.C. voltage at 59, and direct current will therefore flow through diodes 47 and 48, and thence through the vario-losser network (resistor 25 and diode 27 in parallel with resistor 26 and diode 28) and to ground through resistor 53. The flow of D.C. current through the vario-losser network reduces the signal amplitude fed into the transformer 31, and therefore the signal output is reduced. The point Q on FIGURE 4 indicates the point at which diodes 47 and 48 begin to conduct. This point may be varied by varying the resistance of the variable resistor 53.

It will be noted that the circuit of FIGURE 3, in contrast with vario-losser circuits known in the prior art, begins its operation in compression fashion with current flowing through the vario-losser circuit at low signal levels. Expansion is achieved by an independent expansion circuit which automatically cuts itself off from the circuit after the expansion phase ends. The compression circuit then goes into operation at very high signal levels without affecting or being affected by the expansion craft. Any D.C. current flowing through the vario-losser circuit during the compression phase of operation cannot affect the expansion circuit because of the blocking action of the diode 41. Thus the compression and expansion circuits are effectively isolated from one another.

It will also be noted that both halves of the signal output are rectified by diodes 47 and 48 in the compression phase of operation, whereas in the expansion phase only one half of the output is rectified by diode 42. This is because the compression circuit is more critical than the expansion circuit in usual applications. For example, human speech, in contrast to music, may possess unbalanced wave forms which produce greater negative amplitude peaks than positive peaks, or conversely. Since circuits following the signal output from amplifier 36 may be adversely affected if the amplitude on either the negative or positive peak is excessive, it is generally desirable to insure that compression occurs for excessive amplitude on both positive and negative peaks. On the other hand, the expansion circuit begins to operate at low signal levels, and therefore following circuits connected across terminals 37 and 38 are not critically influenced during the expansion phase.

The circuit can however, be redesigned to incorporate balanced expansion diodes instead of the single expansion diode 42, acting on both halves of the output instead of on only one half, but this is not necessary. The expansion control circuit might also be redesigned to act on the input signal rather than the output signal. This would probably necessitate, however, the use of a further amplification means to amplify the input signal. The positive feedback effect during expansion would be eliminated if the expansion circuit were connected to the input circuit rather than the output circuit.

Capacitors 54 and 55 are merely for A.C. by-pass and for stability purposes, and do not otherwise affect the operation of the circuits.

It is not necessary that the expansion and threshold potentials (appearing at points 58 and 59 respectively)

be obtained from the series voltage divider network shown. They might be obtained by separate sources of D.C. voltage. Diodes might be substituted for resistors 25 and 26. The use of the diodes instead of these resistors gives a non-logarithmic voltage rise characteristic, and therefore resistors are preferable. In any case, the diodes 27 and 28 and resistors 25 and 26 (or diodes if these are used) should be carefully balanced for optimum operation.

Capacitor 44 and resistor 43, in addition to acting as circuit elements across which a D.C. voltage can be developed by the rectifier 42, provide a time-constant circuit which affords linear operation. A similar time constant network is present in the compression circuit, comprising capacitor 49 in series with resistor 25 and diode 27 which are in parallel with resistor 26 and diode 28.

Normally the "attack time," i.e. the time necessary for the circuit to adjust to expansion or compression operation as signal level rises, is quite short compared with changes in amplitude of speech or music, for example. However, the amount of time necessary for the circuit to "relax" from compression to linear range is of the order of half a second, and the amount of time necessary for the circuit to readjust from the high linear range 2 to the lower linear range 1 is appreciably longer than the attack time. This longer relaxation time is necessary because of the RC time-constants in the expansion and compression circuits which are necessary for optimum linear behavior.

The circuit will probably operate successfully up to a maximum of perhaps one hundred thousand cycles. This is more than sufficient for speech and music.

Most of the circuit values are not critical, as long as the circuit is properly balanced. Circuit values used in a successful embodiment of the circuit are as follows:

Capacitors 21 and 22—.15 microfarad.
Resistors 23, 24, 34, 35, and 43—100,000 ohms.
Capacitor 44—1 microfarad.
Capacitors 33, 49, and 46—2 microfarads.
Capacitor 55—16 microfarads.
Capacitor 54—80 microfarads.
Resistors 25 and 26—330,000 ohms.
Resistors 45 and 51—220,000 ohms.
Variable resistor 52—5,000 ohms.
Variable resistor 53—100,000 ohms.
Transformer 31—Hammond Mfg. Co. type 832.
Amplifier 36—Northern Electric model RA75.

Using the above parts list, the D.C. voltage appearing at the point 50 in FIGURE 3 should be +400 volts.

What we claim as our invention is:

1. An electric circuit having an input and an output, said circuit including an amplifier having an input and an output, said amplifier and said electric circuit having a common output; a vario-losser network connected between said amplifier input and the input of said electric circuit; a source of direct current; an expansion circuit interconnecting said D.-C. source and said vario-losser for normally passing a direct current through said vario-losser from said source, said expansion circuit including means connected to said common output for reducing such normal flow of direct current to said vario-losser upon the occurrence of output signals as said common output in excess of a first predetermined signal level and for blocking the flow of direct current through said vario-losser upon the occurrence of output signals at said common output in excess of a second predetermined signal level; and a compression circuit interconnecting said common output and said vario-losser normally biased to block the flow of direct current therethrough from said common output to said vario-losser but responsive to output signals at said common output in excess of a third predetermined signal level to cause a direct current to flow from said common output to said vario-losser, the loss of signal amplitude in said vario-losser varying as a function of the direct current flowing therethrough.

2. A circuit as claimed in claim 1, wherein the third predetermined level is higher than the second predetermined level and the second predetermined level is higher than the first predetermined level.

3. An electric circuit comprising an input circuit, an output circuit coupled to said input circuit and producing an output signal dependent upon the input signal thereto, said input circuit including a diode in shunt relationship with the signal path therein, an expansion circuit interconnecting a D.-C. source and said diode for normally passing a direct current through said diode from said source, said expansion circuit including means connected to said output circuit for reducing such normal flow of direct current to said diode upon the occurrence of output signals at said output circuit in excess of a first predetermined signal level, a compression circuit connected between said output circuit and said diode and producing a direct current flow through said diode when the output signal level exceeds a second predetermined level, the amount of direct current produced by the compression circuit increasing with increasing output signal, and the loss of signal in passing through said input circuit varying as a function of the current passing through said diode.

4. A circuit as claimed in claim 3 wherein the output signal level above which the compression circuit produces a flow of direct current through the diode exceeds the output signal level at which the expansion circuit reduces the flow of current to the said first diode.

5. A circuit as claimed in claim 4, additionally including blocking means connected between the said diode and the said expansion circuit, said blocking means cutting off the expansion circuit from the diode when the signal level to which the expansion circuit is responsive exceeds a third predetermined level.

6. An electric circuit comprising an input circuit, an output circuit connected to the input circuit and producing an output signal in response to an input signal in the input circuit, said input circuit including a diode in shunt relationship with the signal path therein, the loss of input signal in passing through said input circuit varying as a function of flow of direct current through said diode, impedance means interconnecting said diode and a source of direct current for normally passing a direct current through said diode from said source, first rectifier means interconnecting said output circuit and said impedance means for producing a D.-C. voltage across said impedance means upon the occurrence of output signals at said output circuit in excess of a first predetermined level, such D.-C. voltage being in opposition to that normally produced therein by said D.-C. source, blocking means interconnecting said diode with said rectifier means and said impedance means for preventing current flow between said diode and said rectifier and impedance means upon the occurrence of output signals at said output circuit in excess of a second predetermined level, second rectifier means connected between said output circuit and said diode for producing a flow of direct current through said diode when the output signal exceeds a third predetermined value thereby increasing the loss of signal through said input circuit, the third predetermined value exceeding the second predetermined value and the second predetermined value exceeding the first predetermined value, the amount of direct current produced by said second rectifier means increasing with increasing output signal level.

7. Apparatus as claimed in claim 6, wherein the said blocking means is a diode.

8. Apparatus as claimed in claim 6, wherein the said output circuit includes means for amplifying the signal received from the input circuit.

9. An electric circuit comprising an input circuit having a first diode in shunt relationship with the signal path therein, the loss of signal in passing through said input circuit varying according to the amount of direct current flowing through the first diode, an output circuit connected to the input circuit and producing an output signal dependent upon the signal level in the input circuit, a first reference voltage source, a resistor connected between the first reference voltage source and the first diode, whereby current from said first reference voltage source produces a voltage drop across the resistor, an expansion circuit connected to said first diode and to said resistor and including means connected to said output circuit for rectifying a portion of the output signal when the amplitude of said output signal exceeds the drop across said resistor, the expansion circuit controlling the amount of current flowing from said first reference voltage source to said first diode as a function of the direct current produced by said rectifying means, a second diode connected between said first diode and said expansion circuit, said second diode blocking said expansion circuit from said first diode when the output signal level exceeds a predetermined value, a second reference voltage source, and a compression circuit connected to the first diode and to the second reference voltage source and including second rectifier means connected to the output circuit, said second rectifier means rectifying a portion of the output signal when the output signal amplitude exceeds the value of the voltage at said second reference voltage source, the second rectifier means producing flow of current through said first diode thereby increasing the signal loss in said input circuit, the amount of current caused to flow through said first diode by the second rectifier means increasing with increasing output signal level, the voltage drop across the said resistor being smaller than said second reference voltage, and the output signal level above which the second rectifier means produces an output current exceeding the output signal level above which the expansion circuit is blocked from the first diode.

10. Apparatus as claimed in claim 9, wherein the output circuit includes means for amplifying the signal received from the input circuit.

11. A circuit as claimed in claim 10, wherein the input circuit, the amplifier and the output circuit are push-pull.

12. An electric circuit comprising a first capacitor having first and second terminals, a first resistor having first and second terminals and whose first terminal is connected to the second terminal of said first capacitor, a second capacitor having first and second terminals, a second resistor having first and second terminals and whose first terminal is connected to the second terminal of said second capacitor, a first diode having its anode connected to the second terminal of said first resistor, a second diode having an anode connected to the second terminal of said second resistor and having its cathode connected to the cathode of said first diode, a transformer having a primary winding and a secondary winding, a first terminal of the primary winding being connected to the anode of the first diode and the second terminal of the primary winding being connected to the anode of the second diode, an audio frequency push-pull signal amplifier having its input connected across the secondary winding of the transformer and having its output connected to a first terminal and a second terminal of an output circuit, a source of positive voltage, a first variable resistor having a first terminal and a second terminal and having its first terminal connected to the positive terminal of said voltage source, a second variable resistor having a first terminal and a second terminal and whose first terminal is connected to the second terminal of said first variable resistor and whose second terminal is connected to the negative terminal of said voltage source, a third capacitor having a first terminal and a second terminal and whose first terminal is connected to a first terminal of the output circuit, a third diode having its cathode connected to the second terminal of said third capacitor, a fourth diode having its anode connected to the anode of said third diode and having its cathode connected to the anode of said first diode, a first passive circuit element connected between the anode of said third diode and the first terminal of said first variable resistor, a fifth diode having its anode connected to the first terminal of said output circuit, a sixth diode having its anode connected to the second terminal of said output circuit and having its cathode connected to the cathode of said fifth diode and to the cathode of said fourth diode, a fourth capacitor having a first and a second terminal and whose first terminal is connected to the cathode of said sixth diode and whose second terminal is connected to the second terminal of said first variable resistor and to the cathode of said first diode.

13. Apparatus as claimed in claim 12, wherein said first capacitor has a capacitance substantially equal to the capacitance of said second capacitor, and said first resistor has a resistance substantially equal to the resistance of said second resistor.

14. A circuit as claimed in claim 13, wherein the anode of said first diode is connected through a third resistor to the cathode of said fourth diode, and wherein the anode of said second diode is connected to the cathode of said sixth diode through a fourth resistor whose resistance is equal to that of the third resistor

15. A circuit as claimed in claim 14, wherein said passive circuit element includes a fifth resistor in parallel with a fifth capacitor.

16. A circuit as claimed in claim 15, wherein a sixth resistor is connected between the first terminal of said first variable resistor and the cathode of said third diode.

17. A circuit as claimed in claim 16, wherein a first terminal of a sixth capacitor is connected to the second terminal of said first variable resistor and the second terminal of the sixth capacitor is connected to the second terminal of said second variable resistor, and wherein the first terminal of a seventh capacitor is connected to the first terminal of said first variable resistor and the second terminal of said seventh capacitor is connected to the second terminal of said second variable resistor.

References Cited by the Examiner

UNITED STATES PATENTS 2,948,860 8/60 Affelder -------------- 333—14

ROY LAKE, *Primary Examiner.*

HERMAN KARL SAALBACH, *Examiner.*